United States Patent
Yamakoshi

(10) Patent No.: US 6,381,292 B1
(45) Date of Patent: Apr. 30, 2002

(54) PHASE SYNCHRONIZING APPARATUS, PHASE SYNCHRONIZING METHOD AND DISC DRIVE

(75) Inventor: Takamichi Yamakoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/215,007

(22) Filed: Dec. 17, 1998

(30) Foreign Application Priority Data

Dec. 19, 1997 (JP) .............................................. 9-351568

(51) Int. Cl.$^7$ ................................................. H04L 7/00
(52) U.S. Cl. ....................................................... 375/376
(58) Field of Search ................................. 375/371, 372, 375/373, 374, 375, 376; 369/59, 124; 360/50, 51, 70

(56) References Cited

U.S. PATENT DOCUMENTS

| | | | |
|---|---|---|---|
| 3,808,558 A | * | 4/1974 | Toman et al. |
| 5,663,945 A | * | 9/1997 | Hayashi et al. ............. 369/124 |
| 5,905,705 A | * | 5/1999 | Takeda et al. ................ 369/48 |

* cited by examiner

Primary Examiner—Tesfaldet Bocure
(74) Attorney, Agent, or Firm—Frommer Lawrence & Haug LLP; William S. Frommer; Gordon Kessler

(57) ABSTRACT

In a phase synchronizing apparatus and a phase synchronizing method, a plurality of sine-wave signals synchronizing with the rotation of a discoid recording medium and having phases different from each other are generated, amplitudes of the plurality of sine waveforms are successively corrected in accordance with the output of phase comparator, and thereafter the correction results are supplied to a closed loop composed of phase comparison means and clock signal generator. Thereby, even if a phase fluctuation occurs in a time reference signal due to the eccentricity of a discoid recording medium, it is possible to correct a phase error generated in the output of the phase comparator correspondingly to the phase fluctuation and thus, realize a phase synchronizing apparatus and a phase synchronizing method capable of outputting a clock signal accurately following the eccentricity of a discoid recording medium.

9 Claims, 10 Drawing Sheets

PHASE SYNCHRONIZING APPARATUS, PHASE SYNCHRONIZING METHOD AND DISC DRIVE

BACKGROUND OF THE INVENTION

1. Field of the Invention

The present invention relates to a phase synchronizing apparatus and a phase synchronizing method and is preferably applied to a disc drive for recording or reproducing data in or from a discoid recording medium such as a magnetic disc or an optical disc.

2. Description of the Related Art

The servo system for such a disc drive includes, for example, a servo-surface servo system for obtaining servo information from an exclusive servo surface, and an embedded servo system in which a data recording region and a servo information region are formed on the same disc surface in a time-division multiplex manner. To realize the above servo system, a disc drive is provided with a phase synchronizing circuit for generating a servo clock signal continuously synchronizing for one turn of a disc.

As shown in FIG. 1, a phase synchronizing circuit 1 is a so-called phase locked loop (PLL) circuit which consists of a phase comparator 2, a loop filter 3, a voltage control oscillator (VCO) 4, and a frequency divider 5.

A time reference signal S1 obtained by reproducing a clock mark in a servo region formed on the surface of a disc at a regular time interval is supplied to one input terminal of the phase comparator 2. Moreover, a clock signal $S_{CLK}$ output from the VCO 4 is supplied to the other input terminal of the phase comparator 2 via the frequency divider 5 after being frequency-divided into 1/N times (N: natural number). Thereby, the phase comparator 2 generates a voltage corresponding to the phase difference between the time reference signal S1 and the clock signal $S_{CLK}$, and supplies the voltage to the loop filter 3 as a phase error signal S2.

The loop filer 3 applies a predetermined filtering processing such as low-pass filtering to the phase error signal S2 supplied from the phase comparator 2 and thereafter, supplies the processed signal to the VCO 4. The VCO 4 outputs a clock signal $S_{CLK}$ having a frequency and a phase corresponding to the voltage level of the phase error signal S2 obtained through the loop filter 3.

Thus, the phase synchronizing circuit 1 can output the clock signal $S_{CLK}$ having a frequency N times higher than that of the phase error signal S2 and synchronizing with the phase error signal S2 from the VCO 4, by feedback-controlling the phase difference between the phase error signal S2 and the clock signal $S_{CLK}$ so as to keep it constant.

However, in case where the phase synchronizing circuit 1 is applied to such as a variable-medium-type disc drive or a disc drive using a disc in which a phase synchronizing mark is previously embedded in a servo region when the disc is manufactured, it is very difficult to generate a high-accuracy clock signal because the following problems occur.

Firstly, when chucking a disc to a spindle, the effective circumferential speed fluctuates to a high speed at a portion where the substantial radius of a track circle is large, and to a low speed at a portion where it is small, due to an eccentricity in which the center of a rotary shaft and the center of a track circle are offset. Therefore, a problem occurs that a large phase fluctuation occurs in the time reference signal S1 reproduced from the track.

In case where, for example, twelve servo regions for one turn of a disc are formed at regular time intervals, a signal waveform of the time reference signal S1 obtained by reproducing a clock mark in each of the servo regions is shown in FIG. 2A. However, reproduced waveforms except for the clock mark, such as a position signal, track address, synchronizing pattern, and user data, are omitted.

In the time reference signal S1, the servo regions appear at regular time intervals shown by time $t_0$–$t_{12}$ in the case when the disc has no eccentricity. However, if the disc has an eccentricity, the time when the servo region appears is advanced or delayed. The phase-shift value of each servo region in the above case is shown as the arrow attached to the lower stage of the signal waveform of the time reference signal S1.

Therefore, in the time reference signal S1, time intervals for the servo region to appear become dense nearby the time $t_3$ where a track circle has a large substantial radius, whereas they become nondense nearby the time $t_9$ where the track circle has a small substantial radius.

FIG. 2B shows a graph obtained by arranging the phase-shift value of each servo region on the axis of ordinate. In this case, the sine-wave-shaped time reference signal S1 is input to the one input terminal of the phase comparator 2 in the phase synchronizing circuit 1 shown in FIG. 1 as described above.

The PLL of the phase synchronizing circuit 1 requires to accurately follow the phase-shift value of each of time $t_0$–$t_9$. However, since an open loop gain of passing through the phase comparator 2, the loop filter 3, the VCO 4 and the frequency divider 5, generally takes a limited value, a phase of the clock signal $S_{CLK}$ returned to the other input terminal of the phase comparator 2 has an amplitude slightly smaller than that of the time reference signal S1 and is shifted as shown in FIG. 2C.

Therefore, the eccentricity-following residue shown in FIG. 2D occurs in the phase error signal S2 output from the phase comparator 2. For example, in the case where a disc having a radius of 16 mm has an eccentricity of 120 μm while rotating at 75 turns per second, the phase-shift value shows approximately 16 μs. Even if the open loop gain of the PLL at 75 Hz is 60 dB, an eccentricity-following residue of 16 nanoseconds remains.

When the low-frequency gain of the PLL is increased in order to completely follow the phase fluctuation due to the eccentricity, high-frequency noises are increased due to band widening accompanying with the increase of the low-frequency gain, for example. Therefore, the problem occurs that it is very difficult to make the PLL accurately follow a disc eccentricity.

Secondly, to band-wide a PLL without increasing noises, a method of raising the phase comparison frequency by increasing the number of servo regions has been proposed. However, because a lot of time is required to switch over between recording and reproducing particularly in case of a magnetic disc, the utilization efficiency of the data surface lowers when the number of servo regions for one turn of the disc is increased. As a result, it is practically very difficult to form hundreds of servo regions for one turn of the disc.

To solve the above first and second problems, for example, a feedforward compensation method is disclosed (the U.S. Pat. No. 5,615,191) in which eccentricity errors of the phase and frequency of an output clock signal are corrected by previously measuring the eccentricity value of a disc, adding the eccentricity value to a PLL, and thereby making the phase and frequency follow the eccentricity value.

However, according to the aforementioned method, it is necessary to use an eccentricity measurement circuit for measuring the eccentricity value of a disc, and a measurement time equivalent to at least one turn of the disc is required for measurement of the eccentricity value. Moreover, the measured eccentricity value is temporarily stored in a memory. However, because a phase fluctuation value due to eccentricity increases toward inner tracks of the disc, and decreases toward outer tracks of the disc, a large-capacity memory and a large-scale circuit are required if the measured eccentricity value is stored over the entire disc radius to be sought by a head.

Moreover, according to the above-described feedforward compensation method using the open loop, characteristics of the PLL are changed due to temporal changes of element constants of the analog circuit section of such a loop filter and thereby, errors occur in the phase and frequency of an output clock signal. Therefore, the conventional compensation method is insufficient for practical use.

SUMMARY OF THE INVENTION

In view of the foregoing, an object of this invention is to provide a phase synchronizing apparatus, a phase synchronizing method and a disc drive capable of accurately following the eccentricity of a discoid recording medium.

The foregoing object and other objects of the invention have been achieved by the provision of a phase synchronizing apparatus for successively forming a servo region on a discoid recording medium every predetermined interval, obtaining a time reference signal by successively reading the servo regions from the discoid recording medium, and outputting a clock signal synchronizing with the phase of the time reference signal, the phase synchronizing apparatus comprises phase comparison means for outputting the phase difference between the time reference signal and a clock signal, clock signal generation means for generating a clock signal having a phase corresponding to the output of the phase comparison means and thereafter feeding back the clock signal to the phase comparison means, sine-wave-signal generation means for generating a plurality of sine-wave signals having phases different from each other based on a rotation synchronizing signal synchronizing with the rotation of the discoid recording medium, amplitude correction means for successively correcting amplitudes of the plurality of sine-wave signals obtained by the sine-wave-signal generation means in accordance with the output of the phase comparison means, and arithmetic processing means for synthesizing a plurality of sine-wave signals whose amplitudes are corrected by the amplitude correction means and adding them to the output of the phase comparison means.

Thus, by generating a plurality of sine-wave signals synchronizing with the rotation of the discoid recording medium and having phases different from each other, correcting the amplitudes of the sine waveforms successively in accordance with the output of the phase comparison means, and thereafter adding the correction result to a closed loop composed of the phase comparison means and clock-signal generation means, it is possible to correct a phase error produced in the output of the phase comparison means in accordance with a phase fluctuation even if the phase fluctuation occurs in a time reference signal due to the eccentricity value of the discoid recording medium.

Moreover, the present invention uses a phase synchronizing method of successively forming a servo region on a discoid recording medium every predetermined interval, obtaining a time reference signal by successively reading the servo region from the discoid recording medium, and outputting a clock signal synchronizing with the phase of the time reference signal, which comprises the steps of outputting the phase difference between a time reference signal and a clock signal with the phase comparison means, generating a clock signal having a phase corresponding to the output of the phase comparison means and thereafter, feeding back the clock signal to the phase comparison means, generating a plurality of sine-wave signals having phases different from each other with the sine-wave-signal generation means based on a rotation-synchronizing signal synchronizing with the rotation of the discoid recording medium, successively correcting the amplitudes of the plurality of sine-wave signals obtained from the sine-wave-signal generation means with amplitude correction means in accordance with the output of the phase comparison means, and synthesizing the plurality of sine-wave signals whose amplitudes are corrected by the amplitude correction means and adding them to the output of the phase comparison means.

Thus, by generating a plurality of sine-wave signals synchronizing with the rotation of the discoid recording medium and having phases different from each other, successively correcting the amplitudes of the sine waveforms in accordance with the output of the phase comparison means, and thereafter adding the correction result to a closed loop composed of the phase comparison means and the clock-signal generation means, it is possible to correct a phase error produced in the output of the phase comparison means in accordance with a phase fluctuation even if the phase fluctuation occurs in a time reference signal due to the eccentricity value of the discoid recording medium.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings:

(1) Structure of Hard Disk Drive of the Present Invention

Figure 1:
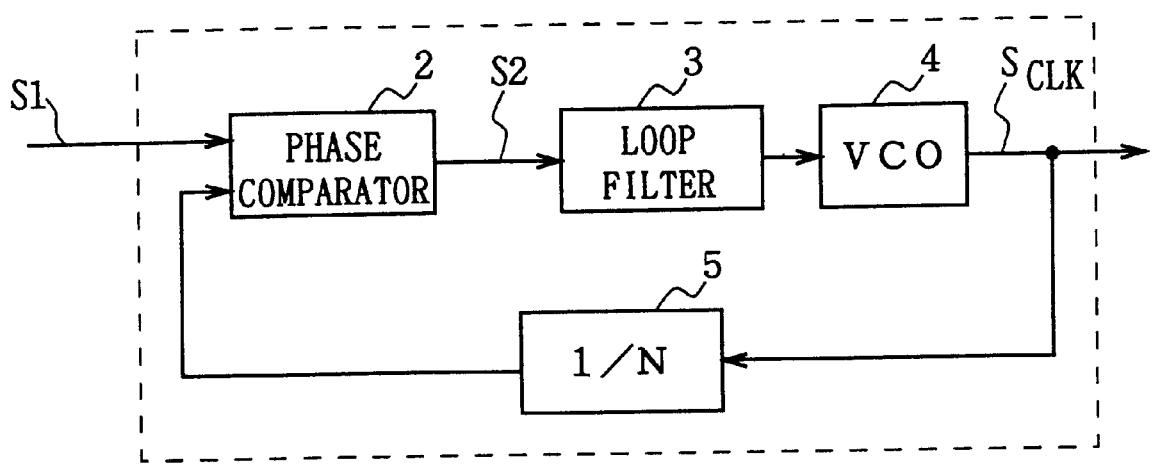
FIG. 1 is a block diagram showing the internal structure of a conventional phase synchronizing circuit.
Figure 2:
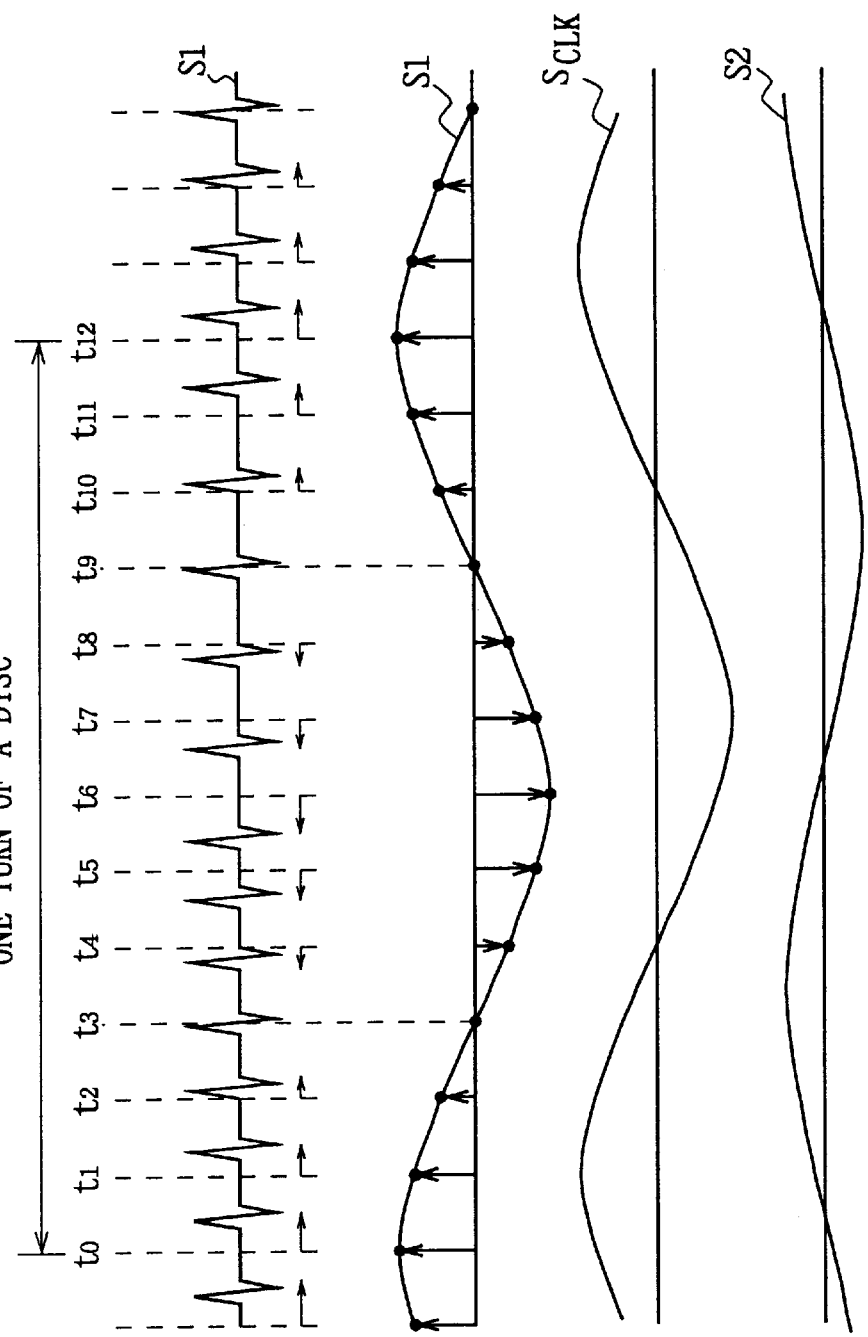
FIGS. 2A to 2D are signal waveform diagrams explaining the operation timing of the phase synchronizing circuit shown in FIG. 1.
Figure 3:
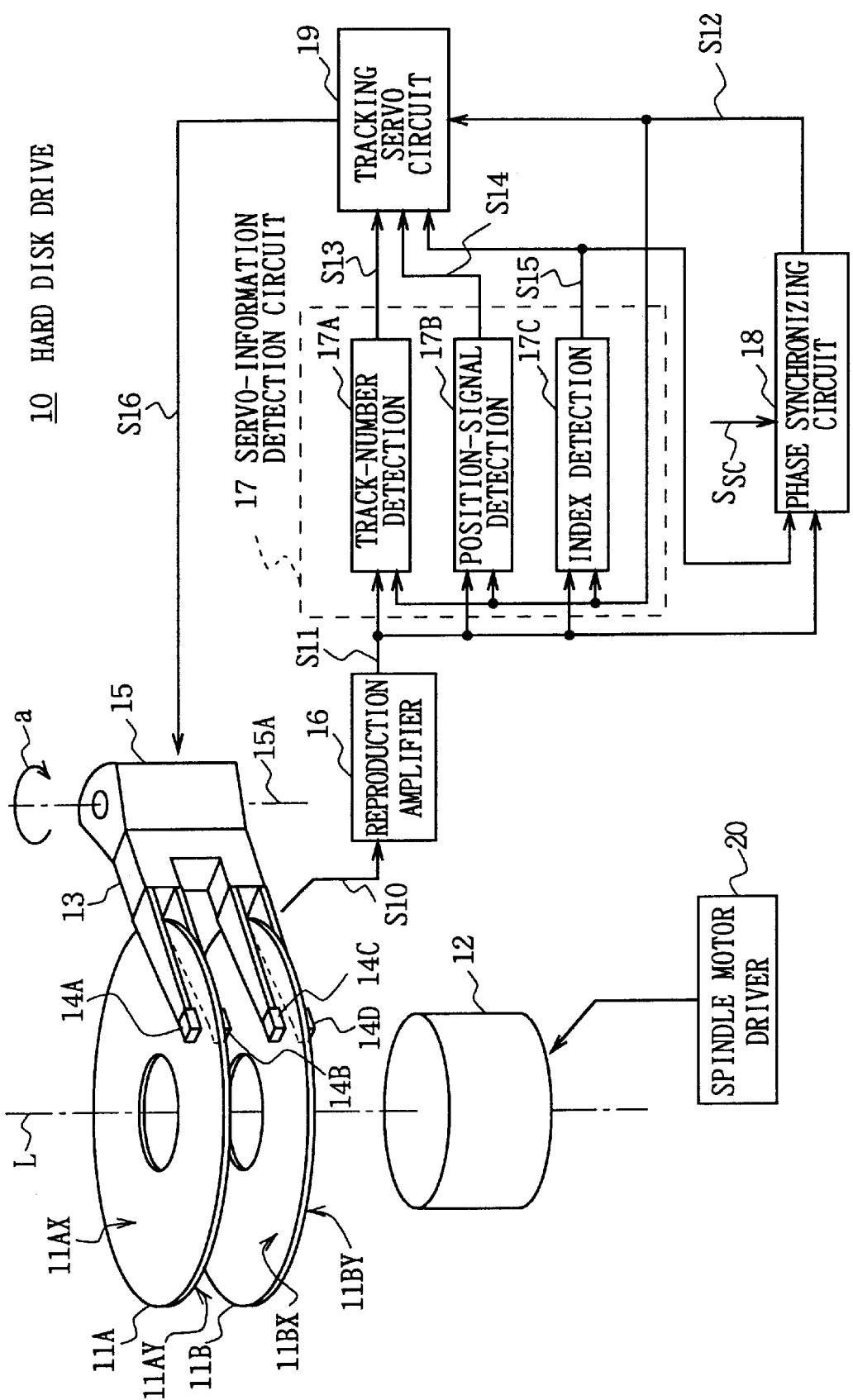
FIG. 3 is a block diagram showing an embodiment of the structure of a hard disk drive according to the present invention.

In FIG. 3, symbol 10 denotes a hard disk drive as a whole. While a plurality of double-sided magnetic discs 11A and 11B rotate with a shaft L as the coaxial center in accordance with the rotation of a spindle motor 12 at a high speed, magnetic heads 14A to 14D set on the respective front ends of a movable arm 13 move with a fixed shaft 15A as the center in the direction shown by the arrow "a" or the direction opposite to the former direction in accordance with the driving of a voice coil motor (VCM) 15. The magnetic heads are adapted to locate the position corresponding to one sides 11AX, 11AY and the other sides 11BX, 11BY of the double-sided magnetic discs 11A, 11B respectively. Thereby, with following each of tracks formed on one side 11AX, 11AY or the other side 11BX, 11BY of the double-sided magnetic discs 11A, 11B, video-audio data are recorded or reproduced.

A plurality of servo regions are embedded in each data recording regions of one sides 11AX, 11AY and the other sides 11BX, 11BY of the double-sided magnetic discs 11A, 11B at regular time intervals, and a clock mark is formed in each of the servo regions.

A reproductive signal S10 obtained by reproducing the clock mark in each of the servo regions of the double-sided magnetic discs 11A and 11B with the magnetic heads 14A to 14D is amplified up to a predetermined amplitude via a reproduction amplifier 16 and thereafter, supplied to a servo-information detection circuit 17, a phase synchronizing circuit 18, and a data demodulation circuit (not illustrated) as a time reference signal S11.

The servo-information detection circuit 17 consists of a track-number detection circuit 17A, a position-signal detection circuit 17B, and an index detection circuit 17C. The time reference signal S11 is input to each of the circuits 17A to 17C and moreover, a clock signal S12 is input to the circuits 17A to 17C from the phase synchronizing circuit 18.

The track-number detection circuit 17A detects information including a track number (cylinder address) and a sector number, etc., from the reproductive waveform of an input servo address field by using such as the Viterbi decoding method and thereafter, transmits the information to a tracking servo circuit 19 at the timing synchronizing with the clock signal S12 as a number-information signal S13. In this connection, the Viterbi decoding method is one of the decoding methods for decoding a convolutional code among error correction codes, and is a decoding method of correcting an error by observing a received data series so as to obtain a code series closest to the data series.

The position-signal detection circuit 17B detects a position error signal (PES) S14 which shows how far the magnetic heads 14A to 14D shift from a target track and thereafter, transmits the signal S14 to the tracking servo circuit 19 at the timing synchronizing with the clock signal S12. Moreover, the index detection circuit 17C transmits an index signal S15 comprising a pulse wave once per turn of a disc to the phase synchronizing circuit 18 and the tracking servo circuit 19.

The phase synchronizing circuit 18 continuously generates the clock signal S12 synchronizing with the rotation of the double-sided magnetic discs 11A and 11B for one turn of the disc, based on the time reference signal S11 and the index signal S15 and thereafter, transmits the clock signal S12 to the tracking servo circuit 19.

The tracking servo circuit 19 computes head position information of the magnetic heads 14A to 14D, based on the number information signal S13, the position error signal S14, and the index signal S15 input at the timing synchronizing with the clock signal S12 and thereafter, transmits the information to the voice coil motor 15 as a head control signal S16.

The voice coil motor 15 can make the magnetic heads 14A to 14D follow target tracks formed on the respective one sides 11AX, 11AY and the other sides 11BX, 11BY of the double-sided magnetic discs 11A, 11B.

In this connection, the clock signal S12 obtained by the phase synchronizing circuit 18 is supplied to a not-illustrated spindle servo circuit. The spindle servo circuit compares the phase of the clock signal S12 with the phase of a reference frequency signal corresponding to a certain linear velocity, in order to control the rotational speed of the spindle motor 12 by driving a spindle motor driver 20 so that the relation between the phases becomes constant.

Figure 4:
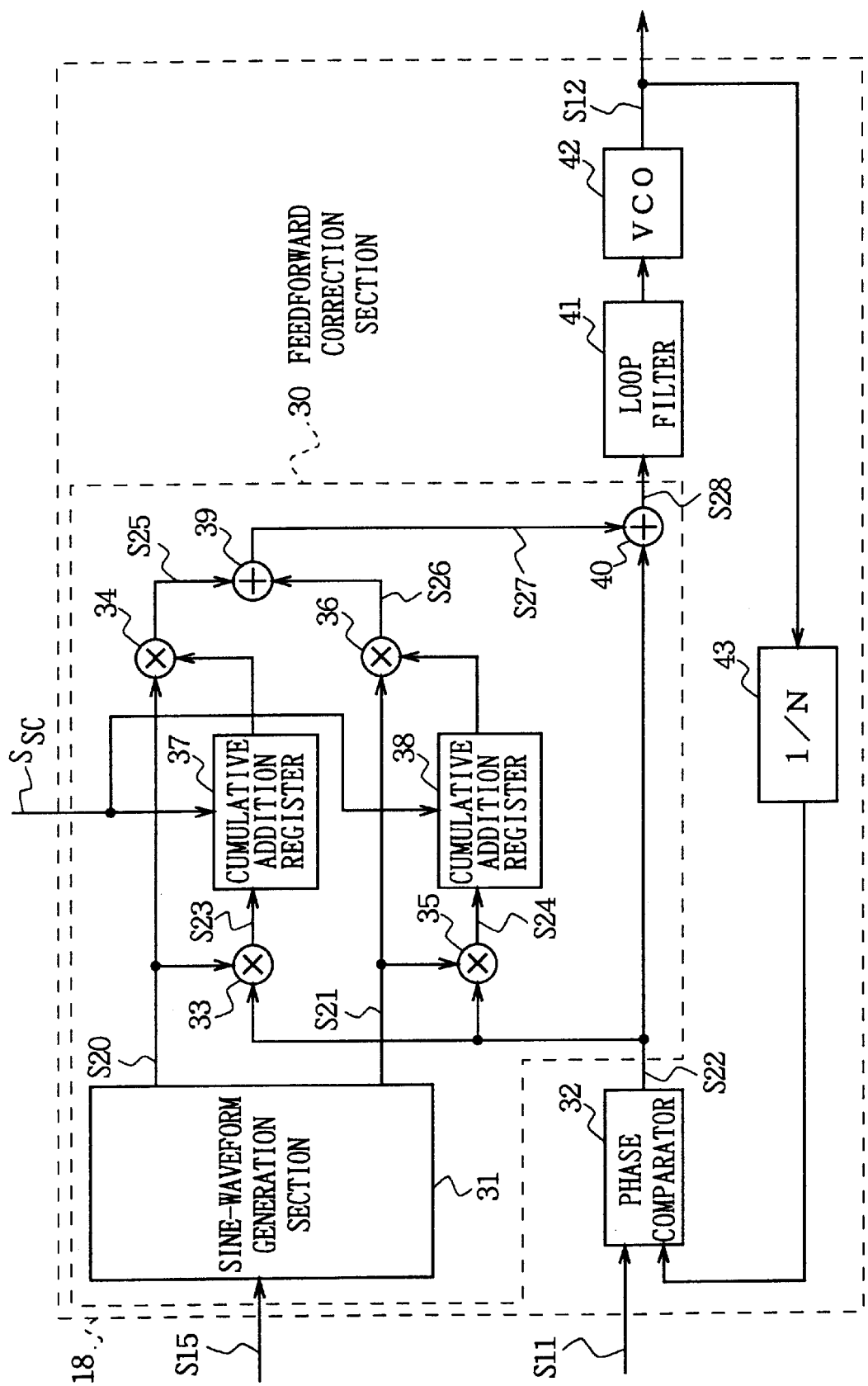
FIG. 4 is a block diagram showing the internal structure of the phase synchronizing circuit of the first embodiment.

(2) First Embodiment (2-1) Structure of Phase Synchronizing Circuit by First Embodiment FIG. 4 shows the phase synchronizing circuit 18 of the first embodiment. In the phase synchronizing circuit 18, the index signal S15 output from the index detection circuit 17C is supplied to a sine-waveform generation section 31 in a feedforward correction section 30, and the time reference signal S11 obtained via the reproduction amplifier 16 is supplied to a phase comparator 32.

Figure 5:
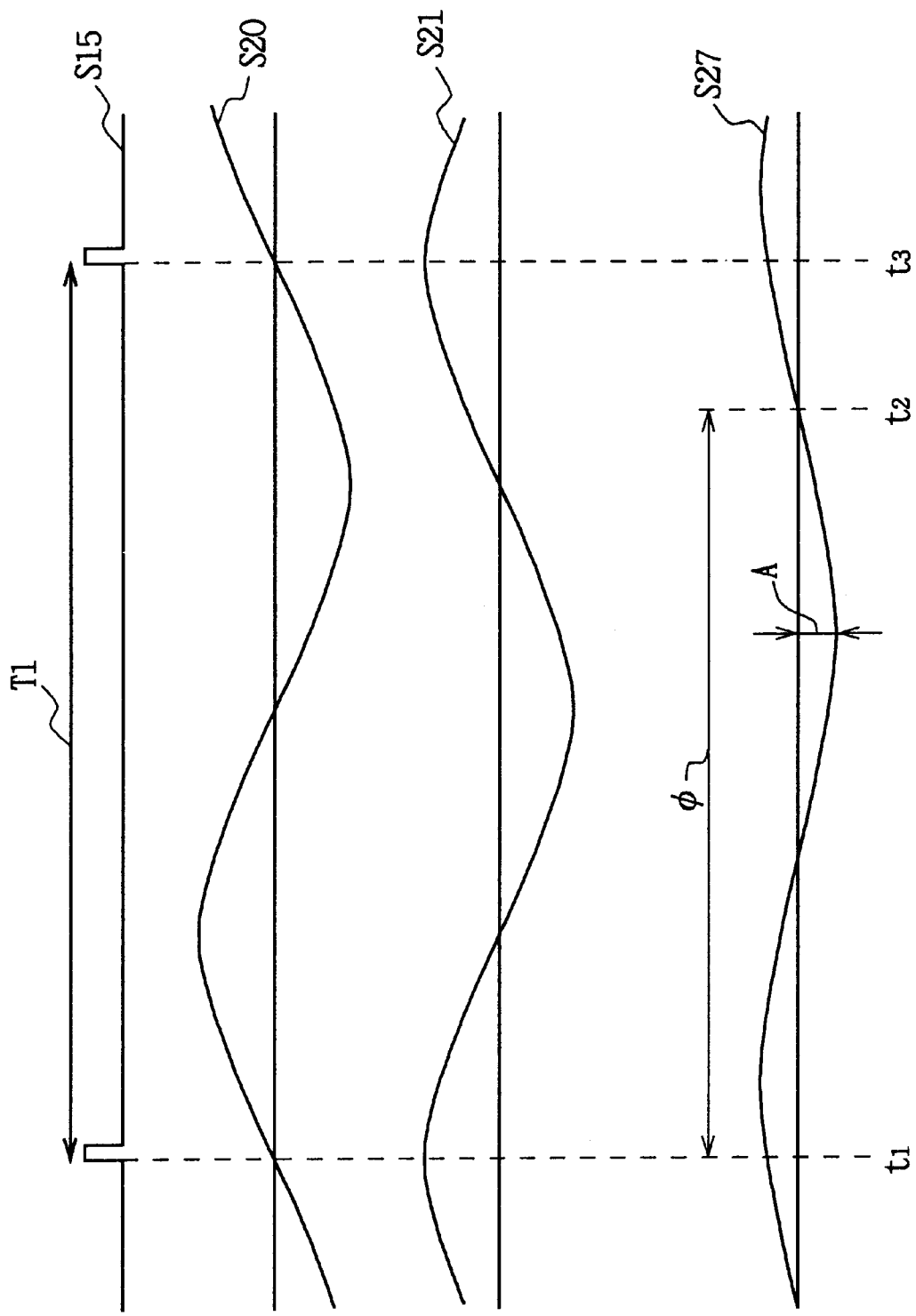
FIGS. 5A to 5D are signal waveform diagrams explaining the operation timing of the sine-waveform generation section according to the first embodiment.

In the feedforward correction section 30, the sine-waveform generation section 31 generates a sine-wave signal S20 (FIG. 5B) employing the disc-one-turn-period T1 between the rise time $t_1$ and the next rise time $t_3$ of the index signal S15 (FIG. 5A) as a period, and a cosine-wave signal S21 (FIG. 5C) whose phase is shifted from that of the signal S20 by 90 degrees. The feedforward correction section 30 thereafter transmits the sine-wave signal S20 to multipliers 33 and 34, and transmits the cosine-wave signal S21 to multipliers 35 and 36. The sine-wave signal S20 and the cosine-wave signal S21 are respectively shown with a phase position during one turn of a disc as a vector value.

The multiplier 33 adjusts the sine-wave signal S20 to a predetermined amplitude by multiplying the phase error signal S22 output from the phase comparator 32 by the signal S20 and thereafter, successively supplies the multiplication result to a cumulative addition register 37 as a sine-wave adjustment signal S23. Moreover, the multiplier 35 adjusts the cosine-wave signal S21 to a predetermined amplitude by multiplying the phase error signal S22 output from the phase comparator 32 by the signal S21 and thereafter, successively supplies the multiplication result to a cumulative addition register 38 as a cosine-wave adjustment signal S24.

The cumulative addition registers 37 and 38 accumulate the successively-input sine-wave adjustment signal S23 and cosine-wave adjustment signal S24 while cumulatively adding them respectively. A cumulative sine-wave adjustment signal S23' and a cumulative cosine-wave adjustment signal S24' read out from the cumulative addition registers 37 and 38 respectively, are multiplied by the sine-wave signal S20 and cosine-wave signal S21 which are prior to the amplitude adjustments, by the multipliers 34 and 36 respectively and then, transmitted to an adder 39 as a sine-wave correction signal S25 and a cosine-wave correction signal S26 respectively.

The adder 39 adds the sine-wave correction signal S25 and the cosine-wave correction signal S26 which cross at right angles in a vector space and thereby, generates a feedforward correction signal S27 (FIG. 5D) having an arbitrary amplitude A and phase φ corresponding to the eccentricity values of the double-sided magnetic discs 11A and 11B and the phase of the index signal S15.

Figure 6:
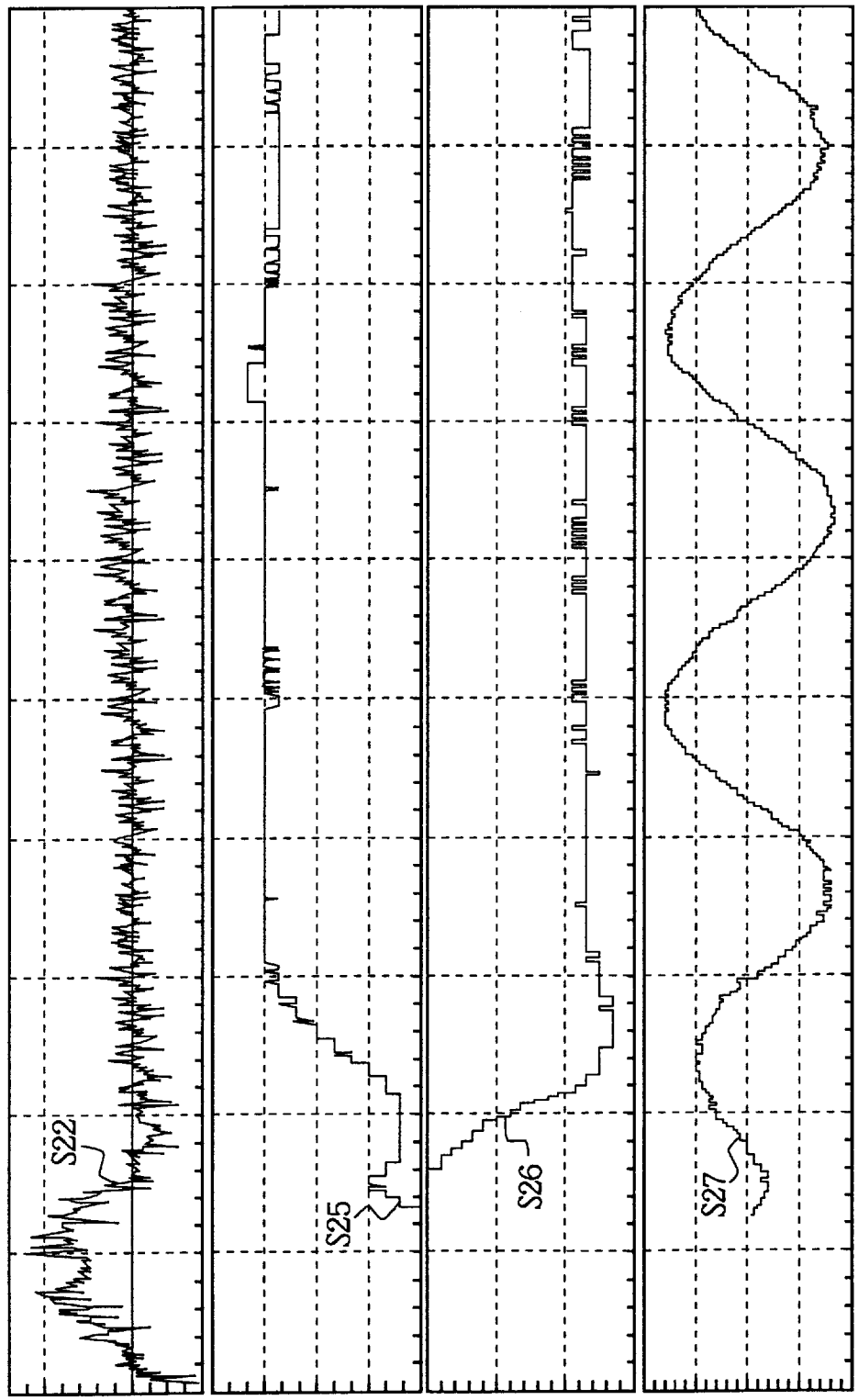
FIGS. 6A to 6D are signal waveform diagrams explaining the operation timing of the feedforward correction section according to the first embodiment.

In this connection, when a phase error occurs due to the eccentricity of a disc and thereby, the phase fluctuation shown in FIG. 6A occurs in the phase error signal S22 correspondingly to the eccentricity value, the cumulative addition registers 37 and 38 in the feedforward correction section 30 start to update of register values from a predetermined time so as to obtain the cumulative sine-wave adjustment signal S23' (FIG. 6B) and the cumulative cosine-wave adjustment signal S24' (FIG. 6C). As a result, it is possible to obtain a feedforward correction signal S27 having the sine waveform shown in FIG. 6D.

The feedforward correction signal S27 thus generated is added to the phase error signal S22 by an adder 40 and then, supplied to a loop filter 41 as an eccentricity-following signal S28.

The loop filter 41 applies a predetermined filtering processing such as a low-pass filtering to the eccentricity-following signal S28 and then, supplies the signal S28 to a VCO 42. The VCO 42 outputs the clock signal S12 having a frequency corresponding to the voltage level of the eccentricity-following signal S28 obtained via the loop filter 41.

Thus, the time reference signal S11 obtained by reproducing clock marks in servo regions formed at regular time intervals on the surface of a disc is supplied to one input terminal of the phase comparator 32 and moreover, the clock signal S12 output from the VCO 42 is supplied to the other input terminal of the phase comparator 32 via a frequency divider 43 by being frequency-divided into 1/N (N: natural number) times. Thereby, the phase comparator 32 can converge the phase error of the time reference signal S11 based on the feedback control by the PLLs 32 and 41 to 43 and moreover, can supply a voltage corresponding to the phase difference between the converged time reference signal S11 and the clock signal S12 to the adder 40 as the phase error signal S22.

Thus, the phase synchronizing circuit 18 feedback-controls the eccentricity-following signal S28 and the clock signal S12 in order to keep the phase difference between the signals S28 and S12 constant and thereby, the phase synchronizing circuit 18 can output the clock signal S12 having a frequency N times higher than that of the eccentricity-following signal S28 and a phase synchronizing with the eccentricity-following signal S28 from the VCO 42.

(2-2) Internal Structure of Sine-waveform Generation Section

Figure 7:
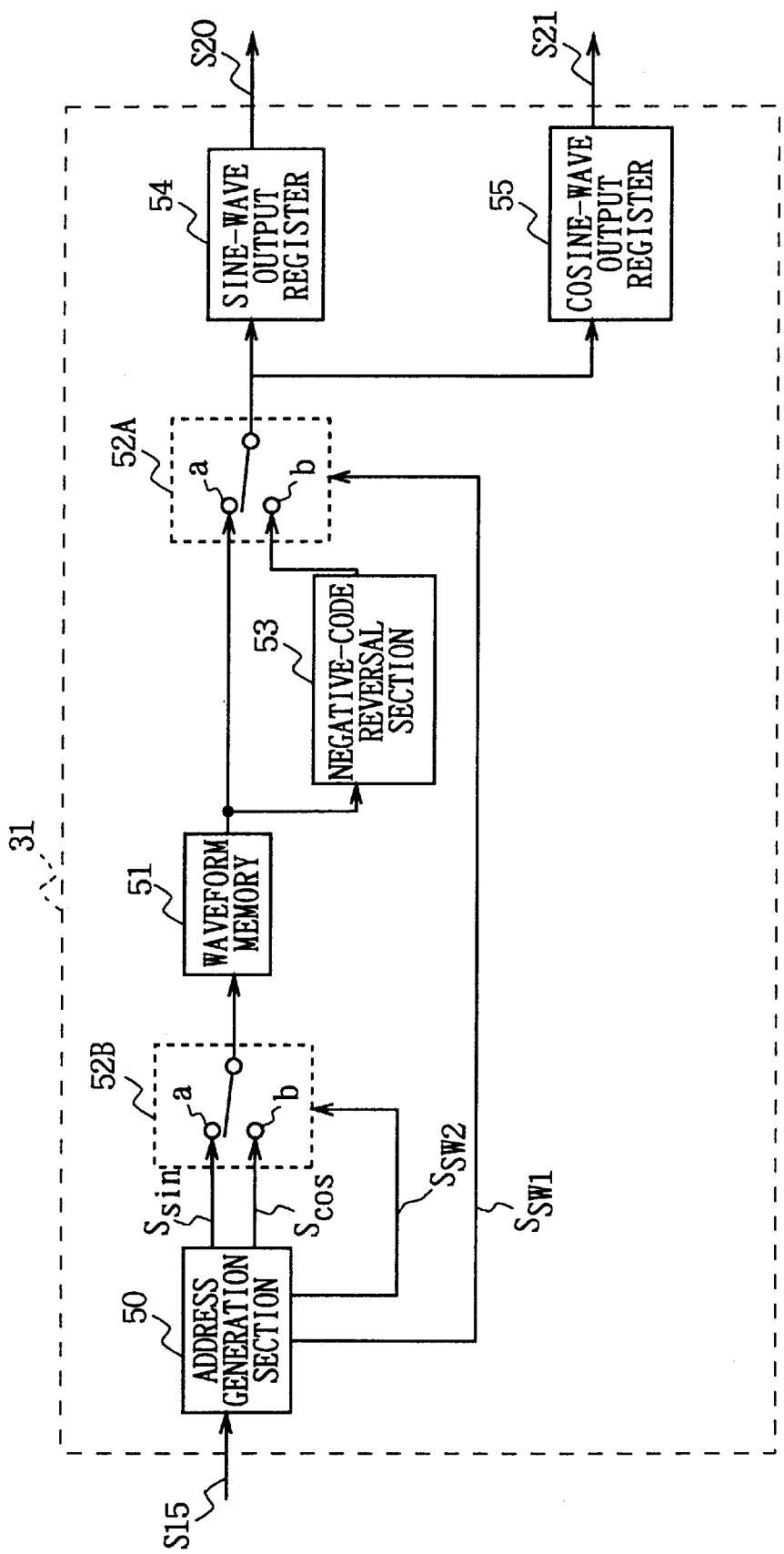
FIG. 7 is a block diagram showing the internal structure of the sine-waveform generation section according to the first embodiment.

In this case, FIG. 7 actually shows the internal structure of the sine-waveform generation section 31. In the sine-waveform generation section 31, an address generation section 50, receiving the index signal S15, generates a clock synchronizing with the timing when a servo region (that is, clock mark) appears every turn of the double-sided magnetic discs 11A and 11B with the rise time of the index signal S15 as a basis.

Moreover, the address generation section 50 has a counter (not illustrated) inside. The counter repeats counting-up or counting-down every disc rotation angle of π/2 rad, while synchronizing with the clock successively generated, so as to generate an address corresponding to a clock against said disc rotation angle.

Figure 8:
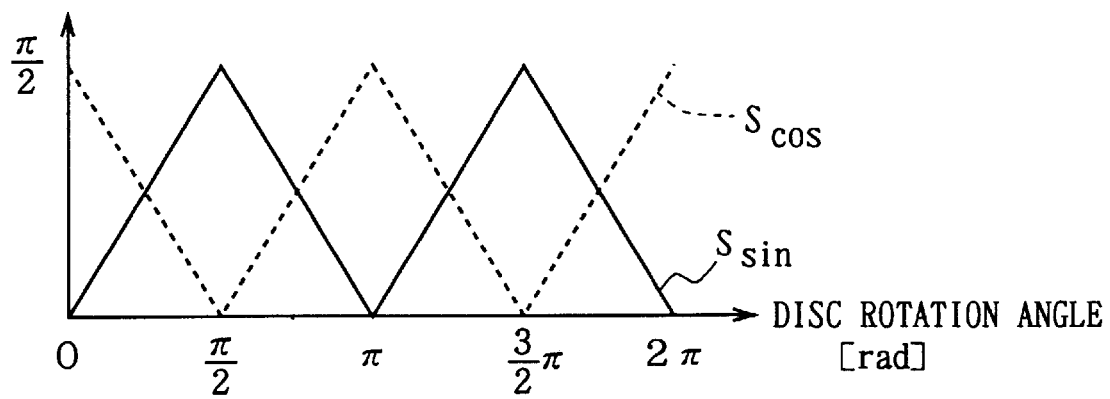
FIG. 8 is a graph explaining a sine-function generation address and a cosine-function generation address generated by the address generation section shown in FIG. 7.

Thus, in the case of the coordinate system shown in FIG. 8 in which disc rotation angle is assigned to abscissa and address is assigned to ordinate, a sine-function generation address $S_{sin}$ (solid line) to which an address is designated correspondingly to a disc rotation angle can be obtained. Moreover, the address generation section 50 can also obtain a cosine-function generation address $S_{cos}$ (broken line) whose phase is shifted by 90 degrees from that of the sine-function generation address $S_{sin}$ in FIG. 8. Therefore, the address generation section 50 supplies the sine-function generation address $S_{sin}$ and the cosine-function generation address $S_{cos}$ to a selector 52B for every clock successively generated.

Moreover, the address generation section 50 transmits a switching control signal $S_{SW2}$ for generating a sine-function signal and a cosine-function signal through time-division operation for every servo zone, to the selector 52B. The selector 52B selects either the sine-function generation address $S_{sin}$ or the cosine-function generation address $S_{cos}$ in accordance with the switching control signal $S_{SW2}$ to supply it to a waveform memory 51.

Figure 9:
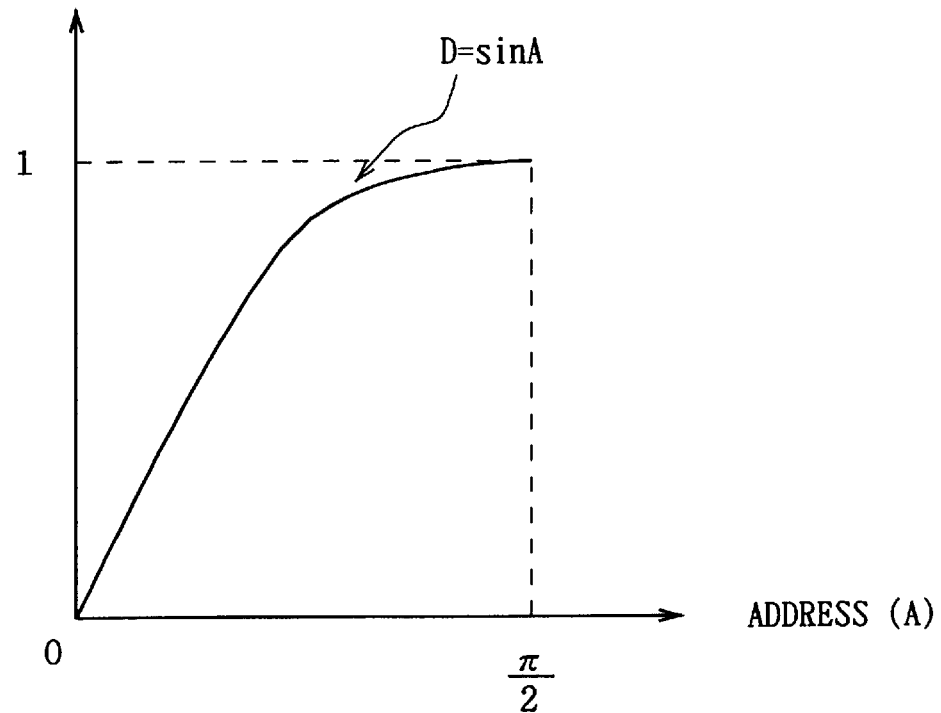
FIG. 9 is a graph explaining the contents of the waveform memory shown in FIG. 7.

The waveform memory 51 bears the relation between input address (A) and output data (D) as shown in FIG. 9. The waveform memory 51 holds a sine-function value represented by D=sinA, by an address range of 0 to π/2 rad (that is, by ¼ wavelength), and outputs a sine-function value corresponding to an angle designated by an address successively input.

A sine-function value read out from the waveform memory 51 is transmitted to one input terminal of a selector 52A, and also transmitted to the other input terminal of the selector 52A after the negative code of said value is reversed via a negative-code reversal section 53.

Moreover, the address generation section 50 transmits a switching control signal $S_{SW1}$ having four types of patterns to the sector 52A for every disc rotation angle of π/2 rad with the rise time of the index signal S15 as a basis. Thereby, the address generation section 50 controls two input terminals of the selector 52A by successively and selectively switching the terminals.

Thus, the selector 52A supplies a reversed or non-reversed sine-function value to a sine-wave output register 54 and a cosine-wave output register 55 through a selected one of the two input terminals.

In this case, the selectors 52A and 52B switch to connect in accordance with the following four types of patterns based on the switching control signals $S_{SW1}$ and $S_{SW2}$, so as to generate a sine-function signal and a cosine-function signal for one wavelength (that is, for one turn of a disc) from a sine-function value equivalent to ¼ wavelength held by the waveform memory 51.

At first, in the period when the disc rotation angle ranges between 0 and π/2 rad with the rise time of the index signal S15 as a basis, input terminals of the selectors 52A and 52B are switched to the side "a" in order to supply a sine-function value in the waveform memory 51 to the sine-wave output register 54 without reversing the negative code of the sine-function value, and latch the value. Then, the input terminal of the selectors 52B is switched to the side "b", in order to supply a sine-function value in the waveform memory 51 to the cosine-wave output register 55 without reversing the negative code of the sine-function value, and latch the value.

Then, in the period when the disc rotation angle ranges between π/2 rad and π rad, the input terminals of the selectors 52A and 52B are switched to the side "a", in order to supply a sine-function value in the waveform memory 51 whose negative code is not reversed to the sine-wave output register 54, and latch the value. Then, the input terminals of the selectors 52A and 52B are switched to the side "b", in order to supply a sine-function value in the waveform memory 51 whose negative code is reversed to the cosine-wave output register 55, and latch the value.

Moreover, in the period when the disc rotation angle ranges between $\pi$ rad and $3/2\pi$ rad, the input terminal of the selector 52A is switched to the side "b" and that of the selector 52B is switched to the side "a" to reverse the negative code of a sine-function value in the waveform memory 51, so as to supply the value to the sine-wave output register 54, and latch the value. Then, the input terminal of the selector 52B is switched to the side "b" to reverse the negative code of a sine-function value in the waveform memory 51, so as to supply the value to the cosine-wave output register 55, and latch the value.

Furthermore, in the period when the disc rotation angle ranges between $3/2\pi$ rad and $2\pi$ rad, the input terminal of the selector 52A is switched to the side "b" and the input terminal of the selector 52B is switched to the side "a", in order to supply the sine-function value in the waveform memory whose negative code is reversed to the sine-wave output register 54, and latch the value. Then, the input terminal of the selector 52A is switched to the side "a" and the input terminal of the selector 52B is switched to the side "b", in order to supply a sine-function value in the waveform memory 51 whose negative code is not reversed to the cosine-wave output register 55, and latch the value.

Thus, the sine-wave output register 54 and the cosine-wave output register 55 can output the sine-wave signal S20 using the one-turn period of a disc as a period with the rise time of the index signal S15 as a basis, and the cosine-wave signal S21 whose phase is shifted by 90 degrees from the signal S20.

(2-3) Structure of Cumulative Addition Register

Figure 10:
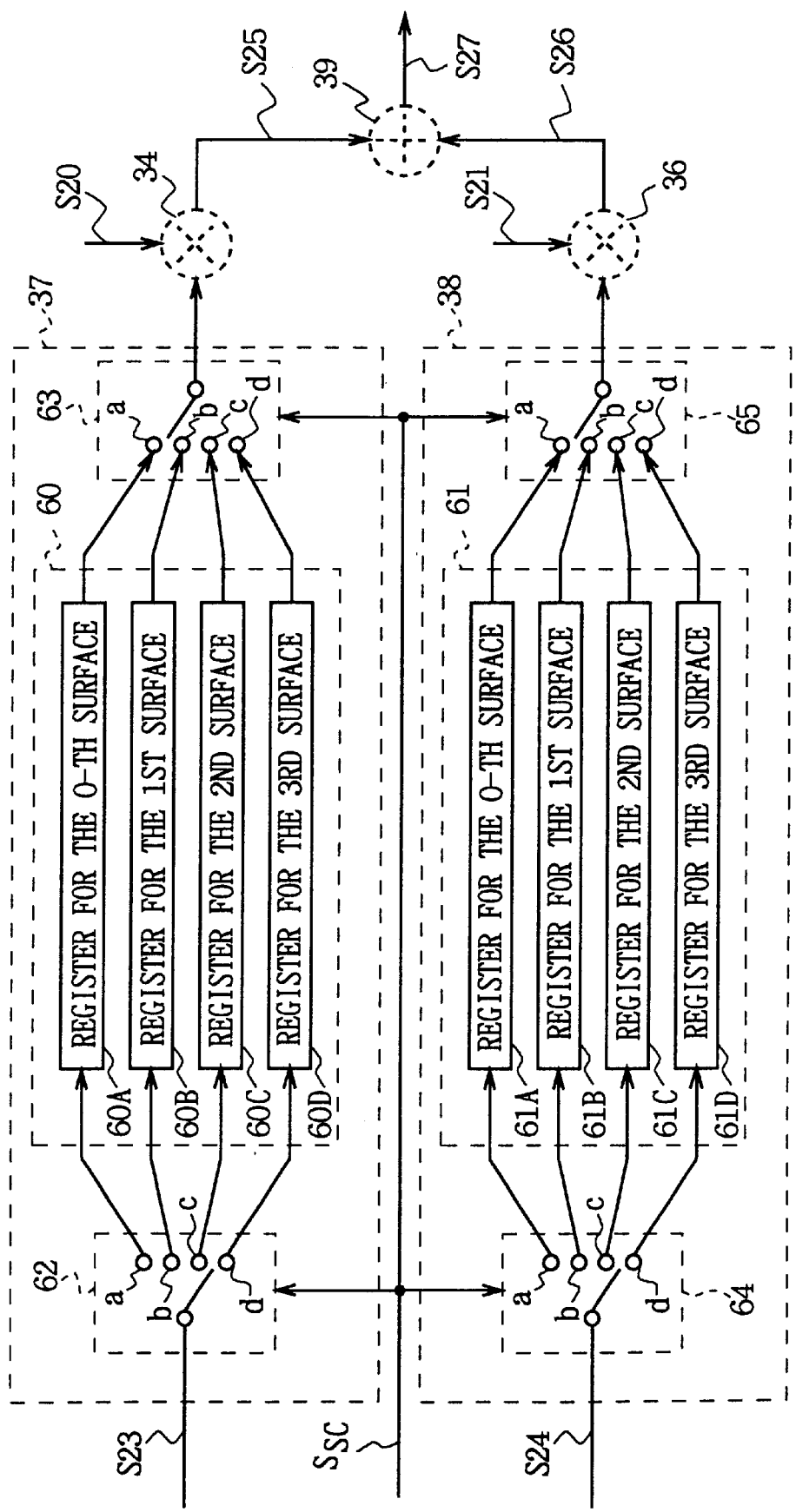
FIG. 10 is a block diagram showing the internal structure of the cumulative addition register according to the first embodiment.

FIG. 10 shows the structures of the cumulative addition registers 37 and 38 serving as actual storage means. The cumulative addition registers 37 and 38 are respectively provided with register groups 60 (60A to 60D) and 61 (61A to 61D) the number of which are corresponding to the plurality of disc surfaces 11AX, 11AY, 11BX, and 11BY (FIG. 3).

A pair of selectors 62 and 63 which have four input and output terminals respectively provided for the front and rear of the register group 60 respectively, and a pair of selectors 64 and 65 which have four input and output terminals are respectively provided for the front and rear of the register group 61 respectively. The selectors 62–65 are interrelatedly switched so as to respectively connect with the input terminal on the same line, based on the switching control signal $S_{SC}$ (FIGS. 3 and 4) obtained from a control section (not illustrated) set in a hard disk drive 10.

Thereby, the cumulative addition registers 37 and 38 respectively accumulate successively-input sine-wave adjustment signal S23 and cosine-wave adjustment signal S24, while cumulatively adding the signals S23 and S24 in the single registers 60A to 60D and 61A to 61D for 0-th to third surfaces respectively selected in order, synchronously with the input timing of the above-mentioned switching control signal $S_{SC}$.

Thus, the register values accumulated in the register groups 60 and 61 are multiplied by the sine-wave signal S20 and the cosine-wave signal S21 by the multipliers 34 and 36 as described above. The multiplication results are added by the adder 39, and the addition result is added to the output of the phase comparator 32 (FIG. 4) as the feedforward correction signal S27.

As a result, by starting to update of the register values of the cumulative addition registers 37 and 38, the feedforward control is started in the feedforward correction section 30. The register values of the cumulative addition registers 37 and 38 are converged, so as to obtain the feedforward correction signal S27 corresponding to the phase fluctuation due to the eccentricity of the double-sided. magnetic discs 11A and 11B. Generally, the time until the register values of the cumulative addition registers 37 and 38 to converge is equal to approximately a half turn period of a disc.

Practically, in the hard disk drive 10 using a plurality of double-sided magnetic discs 11A and 11B, the eccentricity values and phases are normally different between the disc surfaces 11AX, 11AY, 11BX, and 11BY. Therefore, to switch disc surfaces to be accessed, it is necessary to quickly follow the eccentricity of a next disc surface. Therefore, when the cumulative addition registers 37 and 38 start convergence of a register value from the complete initial state, convergence is completed for approximately a half turn period of a disc as described above. However, it is preferable that the disc-surface switching operation can be performed more quickly (for approximately several microseconds).

Therefore, in the case of the first embodiment, all registers of the register groups 60 and 61 are cleared when the power supply of the hard disk drive 10 is turned on or a disc is set or removed. Thereafter, the disc for the 0-th surface (one surface 11AX of the double-sided magnetic disc 11A) is accessed so as to hold a converged register value while successively updating the registers 60A and 61A for the 0-th surface. Then, the first-surface disc (the other surface 11AY of the double-sided magnetic disc 11A) is accessed so as to hold a converged register value while successively updating the registers 60B and 61B for the first surface as same as the above described case.

By continuing the same operation as the above up to the second surface (one surface 11BX of the double-sided magnetic disc 11B) and the third surface (the other surface 11BY of the double-sided magnetic disc 11B), converged register values corresponding to the eccentricity values of disc surfaces of the 0-th to third surfaces is held in the registers 60A to 60D and 61A to 61D for the 0-th to third surfaces respectively.

Thus, by preparing the registers 60A to 60D and 61A to 61D for the 0-th to third surfaces in the cumulative addition registers 37 and 38 for the number of disc surfaces, and previously setting converged register values according to the disc surfaces 11X, 11AY, 11BX, and 11BY respectively corresponding to the registers 60A to 60D and 61A to 61D for the 0-th to third surfaces, it is unnecessary to perform the above-mentioned converging operation again correspondingly to the switching operation even if disc surfaces are switched. As a result, the eccentricity-following operation for a next disc surface can be performed almost instantaneously.

(2-4) Operations and Advantages of First Embodiment

In the hard disk drive 10 according to the above structure, if an eccentricity occurs correspondingly to high-speed rotation of the double-sided magnetic discs 11A and 11B in the recording or reproducing mode, a phase fluctuation corresponding to the eccentricity value occurs in the time reference signal S11 obtained from a serve region on a disc surface.

The time reference signal S11 is transmitted to the phase comparator 32 in the phase synchronizing circuit 18, and also converted into the index signal S15 rising for every turn of a disc via the index detection section 17C, and then transmitted to the feedforward correction section 30 in the phase synchronizing circuit 18.

The feedforward correction section 30 generates the sine-wave signal S20 and cosine-wave signal S21 which cross at right angles in a vector space based on the index signal S15 and then, multiplies the phase error signal S22 obtained from the phase comparator 32 by the signals S20 and S21 respectively. Thereby, a phase error based on the phase error signal S22 is cumulatively added, and held by the cumulative addition registers 37 and 38 as a vector value.

The cumulative addition registers 37 and 38 generate the feedforward correction signal S27 by converging supplied vector values up to values corresponding to the eccentricity values of the double-sided magnetic discs 11A and 11B, while successively updating the vector values and adding the converged vector values via the adder 39.

By adding the feedforward correction signal S27 to the phase error signal S22 obtained from the phase comparator 32, and feedback-controlling the phase-following signal S28 being the addition result through the PLL 32 and 41 to 43, it is possible to make the clock signal S12 being the output of the PLL 32 and 41 to 43 sufficiently follow a phase error based on the eccentricity of a disc in practice.

In this connection, under an initial state in which feedforward control is not performed, only the feedback control using a normal PLL is performed. Therefore, a following error corresponding to the eccentricity value of a disc remains in the phase error signal S22 output from the phase comparator 32.

Therefore, by supplying the feedforward correction signal S27 obtained from the feedforward correction section 30 to the PLL 32 and 41 to 43 to be added an output of the PLL 32 and 41 to 43, it is possible to completely suppress a large phase fluctuation corresponding to a disc rotation frequency even if the phase fluctuation occurs in the time reference signal S11 due to the eccentricity of a disc. Moreover, by performing the phase following over the entire frequency region in the closed loop band of the PLL 32 and 41 to 43 through the feedback control of the PLL 32 and 41 to 43, it is possible to finally perform the phase following for an extremely small phase error of approximately 1 or 2 nanoseconds. Thus, the phase synchronizing circuit 18 is very effective because it is unnecessary to previously measure the eccentricity value of a disc.

In the hard disk drive 10 according to the above structure, the feedforward correction section 30 is set in the phase synchronizing circuit 18. In the feedforward correction section 30, a plurality of sine waves respectively synchronizing with the rotation of a disc and having phases and/or frequencies different from each other are generated, the plural sine waves are successively corrected in accordance with the output of the phase comparator 32, and the correction results are supplied to the PLL 32 and 41 to 43. Thereby, even if a large phase fluctuation equivalent to a disc rotation frequency occurs in the time reference signal S11 due to the eccentricity of a disc, a phase error generated in the output of the phase comparator 32 according to fluctuation can be corrected. Thus, the phase synchronizing circuit 18 capable of outputting the clock signal S12 accurately following the eccentricity of the disc can be realized.

Figure 11:
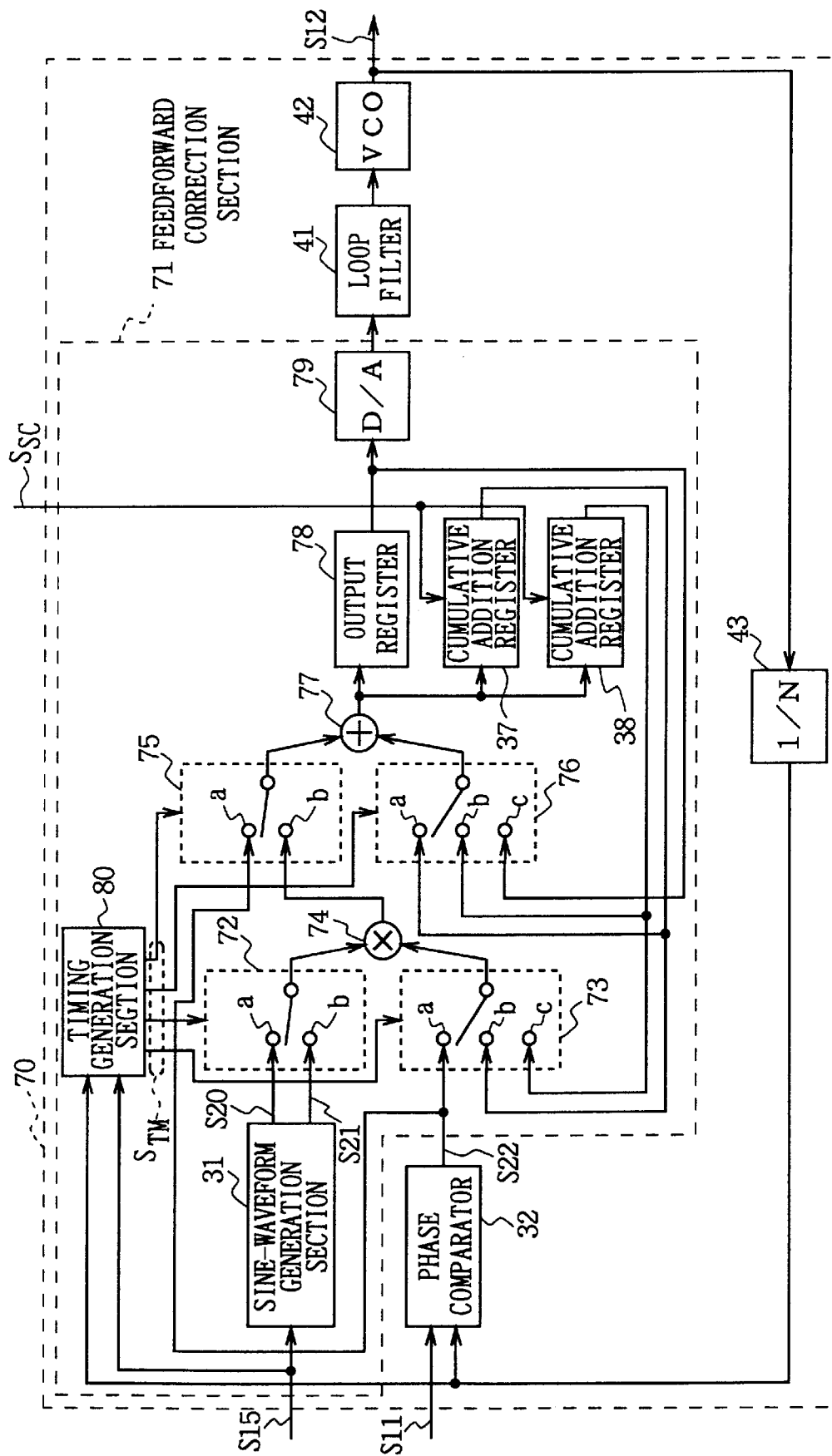
FIG. 11 is a block diagram showing the internal structure of the phase synchronizing circuit, according to the second embodiment.

(3) Second Embodiment (3-1) Structure of Phase Synchronizing Circuit by Second Embodiment FIG. 11 in which a portion corresponding to that in FIG. 4 is provided with the same symbol, shows a phase synchronizing circuit 70 by the second embodiment to be applied instead of the phase synchronizing circuit 18 in the hard disk drive 10 shown in FIG. 3. The phase synchronizing circuit 70 is constituted as same as the phase synchronizing circuit 18 by the first embodiment except that the structure of a feedforward correction section 71 is different.

In the feedforward correction section 71, the sine-waveform generation section 31 generates the sine-wave signal S20 and the cosine-wave signal S21 by performing the above-described processing based on the index signal S15 and thereafter, inputs the signals S20 and S21 to one input terminal and the other input terminal of a selector 72 respectively. Moreover, the phase error signal S22 of the phase comparator 32 and outputs of the cumulative addition registers 37 and 38 are respectively input to three input terminals of a selector 73.

A multiplier 74 multiplies the signals selected by the selectors 72 and 73 and thereafter, outputs the multiplication result to one input terminal of a selector 75. The phase error signal S22 output from the phase comparator 32 is input to the other input terminal of the selector 75. Moreover, outputs of the cumulative addition registers 37 and 38 and the output of an output register 78 are respectively input to three input terminals of a selector 76.

An adder 77 adds the signals selected by the selectors 75 and 76 and thereafter, supplies the addition result to the cumulative addition registers 37, 38 and the output register 78.

Moreover, a timing generation section 80 is set in the feedforward correction section 71. The clock signal S12 output from the VCO 42 is supplied to the timing generation section 80 by being frequency-divided into 1/N times through the frequency divider 43 and moreover,the index signal S15 is supplied to the timing generation section 80. The timing generation section 80 successively transmits a predetermined timing signal $S_{TM}$ to the selectors 72, 73, 75, and 76 for every servo region (that is, every clock mark) formed on the surface of a disc with the rise time of the index signal S15 as a basis, based on the index signal S15 and the clock signal S12.

The selectors 72, 73, 75, and 76 successively repeat the first to sixth switching pattern described below based on the successively-input timing signal $S_{TM}$ and thereby, switch the input terminals of the selectors 72, 73, 75, and 76 to input terminal sides corresponding to respective switching patterns.

As the first switching pattern, the contents of the output register 78 are cleared. As the second switching pattern, the input terminal of the selector 72 is switched to the side "a" and the input terminal of the selector 73 is switched to the side "a". Thereby, the multiplier 74 multiplies the sine-wave signal S20 and the phase error signal S22. Moreover, by switching the input terminal of the selector 75 to the side "b" and the input terminal of the selector 76 to the side "a", the adder 77 outputs the sum of the multiplication result from the multiplier 74 and the register value of the cumulative addition register 37. Thus, the cumulative addition register 37 latches the addition result from the adder 77, and updates the register value.

As the third switching pattern, the input terminal of the selector 72 is switched to the side "b" and the input terminal of the selector 73 is switched to the side "a". The multiplier 74 multiplies the cosine-wave signal S21 and phase error signal S22. Moreover, by switching the input terminal of the selector 75 to the side "b" and the input terminal of the selector 76 to the side "b", the adder 77 outputs the sum of the multiplication result from the multiplier 74 and the register value of the cumulative addition register 38. Thus, the cumulative addition register 38 latches the addition result from the adder 77, and updates the register value.

As the fourth switching pattern, the input terminal of the selector 72 is switched to the side "a" and the input terminal of the selector 73 is switched to the side "b". The multiplier 74 multiplies the sine-wave signal S20 and the register value of the cumulative addition register 37. Furthermore, by switching the input terminal of the selector 75 to the side "b" and the input terminal of the selector 76 to the side "c", the adder 77 outputs the sum of the multiplication result from the multiplier 74 and the register value of the output register 78. In this case, since the register value of the output register 78 is cleared, the output of the adder 77 becomes a value obtained by amplitude-adjusting the sine-wave signal S20 with the register value of the cumulative addition register 37. Thus, the output register 78 latches the addition result from the adder 77 to hold the register value.

As the fifth switching pattern, the input terminal of the selector 72 is switched to the side "b" and the input terminal of the selector 73 is switched to the side "c". The multiplier 74 multiplies the cosine-wave signal S21 and the register value of the cumulative addition register 38. Furthermore, by switching the input terminal of the selector 75 to the side "b" and the input terminal of the selector 76 to the side "c", the adder 77 outputs the sum of the multiplication result from the multiplier 74 and the register value of the output register 78.

In this case, the cosine-wave signal S21 amplitude-adjusted by the cumulative addition register 38 is included in the multiplication result from the multiplier 74 and moreover, the sine-wave signal S20 amplitude-adjusted by the cumulative addition register 37 is held in the output register 78. Therefore, the addition result from the adder 77 is the same as the feedforward correction signal S27 (FIG. 4) described above in the first embodiment. Thus, the output register 78 latches the addition result to hold the register value.

As the sixth switching pattern, the input terminal of the selector 75 is switched to the side "a" and the input terminal of the selector 76 is switched to the side "c". The adder 77 outputs the sum of the phase error signal S22 and the register value of the output register 78. In this case, since the addition result from the adder 77 is equal to a value obtained by adding the phase error signal S22 to the feedforward correction signal S27, the output register 78 latches the addition result to hold the register value.

By executing the above-described first to sixth switching patterns, the addition result, which is finally output to the loop filter 41, of the phase error signal S22 and the feedforward correction signal S27 is held in the output register 78 as the register value. The register value held in the output register 78 is analog-converted via a D/A converter 79, undergoes the predetermined filtering processing such as low-pass filtering via the following loop filter 41 and then, supplied to the VCO 42. The VCO 42 outputs the clock signal S12 having a frequency and a phase corresponding to an input voltage level.

(3-2) Advantages by Second Embodiment

According to the above structure, the feedforward correction section 71 in the phase synchronizing circuit 70, as same as the case of the first embodiment described above, generates a plurality of sine waveforms respectively synchronizing with the rotation of a disc and having phases and/or frequencies different from each other, successively corrects amplitudes of the plural of sine waveforms in accordance with the output of the phase comparator 32, and thereafter supplies the correction results to the PLL 32 and 41 to 43. Thereby, even if a large phase fluctuation corresponding to a disc rotation frequency occurs in the time reference signal S11 due to the eccentricity of a disc, it is possible to correct a phase error generated in the output of the phase comparator 32 correspondingly to the phase fluctuation and thus, realize the phase synchronizing circuit 70 capable of outputting the clock signal S12 accurately following the eccentricity of the disc.

Moreover, since the selectors 72, 73, 75, and 76 are set to the front stages of the multiplier 74 and adder 77 in the feedforward correction section 71 so that the timing generation section 80 switching controls selectively, the structure of the feedforward correction section 71 can be simplified.

(4) Other Embodiments

For the first and second embodiments, a case is described in which the sine-waveform generation section (sine-wave-signal generation means) 31 for generating a plurality of sine waveforms each synchronizing with the rotation of a disc and having phases and/or frequencies different from each other, generates a clock synchronizing with the timing wheh a servo region appears every turn of the disc inside. However, the present invention is not restricted to the above-described case, but it is also possible to generate the clock in accordance with the time reference signal S11.

Moreover, for the first and second embodiments, a case is described in which the sine-waveform generation section 31 generates sine waves and cosine waves by using the address generation section 50 and waveform memory 51. However, the present invention is not restricted to the above-described case, but it is also possible to apply a method using an analog oscillator or a numerical-value arithmetic circuit, in order to generate sine waves and cosine waves. Moreover, for the sine-waveform generation section 31, a case is described in which a sine-function value equivalent to only ¼ wavelength is stored in the waveform memory 51 by using the negative-code reversal section 53 and selectors 52A and 52B. However, it is also possible to store a sine-function value equivalent to one wavelength by increasing the capacity of each waveform memory.

Furthermore, for the first and second embodiments, a case is described in which the sine-waveform generation section 31 generates the sine-wave signal S20 and cosine-wave signal S21 each synchronizing with the rotation of a disc and cross at right angles in a vector space. However, the present invention is not restricted to the above-described case, but it is also possible to generate three or more sine waveforms each synchronizing with the rotation of a disc and having phases and/or frequencies different from each other. In this case, it is necessary to increase the number of circuits in the feedforward correction section 30 correspondingly to the number of sine waveforms.

Furthermore, for the first and second embodiments, a case is described in which the feedforward correction sections 30 and 71 serving as the sine-wave-signal generation means, the phase correction means and the arithmetic processing means, are constituted in the phase synchronizing circuits 18 and 70 as shown in FIGS. 4 and 11 respectively. However, the present invention is not restricted to the above-described case, but it is also possible to apply one of various other types of circuit structures to a feedforward correction section.

Furthermore, for the above-described embodiments, a case is described in which the PLL 32 and 41 to 43 serving as the phase comparison means and the clock-signal generation means are constituted as shown in FIGS. 4 and 11. However, the present invention is not restricted to the above-described case, but it is possible to apply one of various other types of circuit structures to a PLL.

Furthermore, for the first and second embodiments, a case is described in which the present invention is applied to the hard disk drive 10 for recording or reproducing data in or from the double-sided magnetic discs 11A and 11B. However, the present invention is not restricted to the above-described case, but it is also possible to widely apply the present invention to units requiring a phase synchronizing circuit for recording or reproducing data in or from a discoid recording medium. In this case, it is possible to use one of other types of media as a discoid recording medium.

As described above, according to the present invention, a plurality of sine-wave signals synchronizing with the rotation of a discoid recording medium and having phases different from each other are generated, the plurality of sine waveforms are successively amplitude-corrected in accordance with the output of the phase comparison means, and then the correction results are supplied to a closed loop constituted with the phase comparison means and the clock-signal generation means. Thereby, even if a phase fluctuation occurs in a time reference signal due to the eccentricity value of the discoid recording medium, it is possible to correct a phase error generated in the output of the phase comparison means correspondingly to the phase fluctuation and thus, realize a phase synchronizing apparatus and a phase synchronizing method capable of outputting a clock signal accurately following the eccentricity of a discoid recording medium.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A phase synchronizing apparatus for successively forming a servo region on a discoid recording medium at predetermined intervals, obtaining a time reference signal by successively reading out said servo region from said discoid recording medium, and outputting a clock signal synchronized with the phase of said time reference signal, said phase synchronizing apparatus comprising:

phase comparison means for outputting a phase difference between said time reference signal and said clock signal;

clock-signal generation means for generating said clock signal having a phase corresponding to the output of said phase comparison means and thereafter, for feeding said clock signal back to said phase comparison means;

sine-wave-signal generation means for generating a plurality of sine-wave signals based on a rotation-synchronizing signal synchronized with the rotation of said discoid recording medium and having phases different from each other;

amplitude correction means for successively correcting each amplitude of said plurality of sine-wave signals obtained from said sine-wave-signal generation means in accordance with the output of said phase comparison means; and arithmetic processing means for synthesizing said plurality of sine-wave signals whose amplitudes are corrected by said amplitude correction means, and adding said synthesized plurality of sine-wave signals to the output of said phase comparison means.

2. The phase synchronizing apparatus according to claim 1, wherein said amplitude correction means comprises:

multiplication means for multiplying each of said plurality of sine-wave signals obtained from said sine-wave-signal generation means by the output of said phase comparison means; and storage means for successively storing each multiplication result from said multiplication means.

3. The phase synchronizing apparatus according to claim 2, wherein the number of said storage means corresponds to the number of said discoid recording media that may be processed by said phase synchronizing apparatus.

4. A phase synchronizing method for successively forming a servo region on a discoid recording medium at predetermined intervals, obtaining a time reference signal by successively reading out said servo region from said discoid recording medium, and outputting a clock signal synchronized with the phase of said time reference signal, said phase synchronizing method comprising the steps of:

outputting a phase difference between said time reference signal and said clock signal;

generating said clock signal having a phase corresponding to the output phase difference;

feeding said clock signal back to be utilized in said outputting step;

generating a plurality of sine-wave signals based on a rotation-synchronizing signal synchronized with the rotation of said discoid recording medium and having phases different from each other;

successively correcting the amplitude of each of said generated plurality of sine-wave signals in accordance with the output phase difference;

arithmetically synthesizing said plurality of sine-wave signals; and adding the synthesized sine-wave signals to the output phase difference.

5. The phase synchronizing method according to claim 4, wherein successively correcting the amplitude of each of said plurality of generated sine-wave signals further comprises the steps of:

multiplying each of said plurality of sine-wave signals by the output phase difference; and successively storing the multiplication results.

6. The phase synchronizing method according to claim 5, wherein the number of stored multiplication results corresponds to the number of said discoid recording media that can be processed by said phase synchronizing method.

7. A disc device for forming a servo region on a discoid recording medium at predetermined intervals, obtaining a time reference signal by successively reading out said servo region from said discoid recording medium, and controlling a rotation of said discoid recording medium based on a clock signal synchronized with the phase of said time reference signal, said disc device comprising:

a spindle motor for rotating a discoid recording medium;

a head for reading or writing a signal from or on said discoid recording medium;

a head drive for moving said head between an inner track and an outer track of said discoid recording medium;

a tracking servo circuit for controlling the motion of said head drive; and a phase synchronizing apparatus for generating a servo clock signal, said phase synchronizing apparatus comprising:

phase comparison means for outputting a phase difference between said time reference signal and said clock signal;

clock-signal generation means for generating said clock signal having a phase corresponding to the output of said phase comparison means and thereafter, for feeding said clock signal back to said phase comparison means;

sine-wave-signal generation means for generating a plurality of sine-wave signals based on a rotation-synchronizing signal synchronized with the rotation of said discoid recording medium and having phases different from each other;

amplitude correction means for successively correcting each amplitude of said plurality of sine-wave signals obtained from said sine-wave-signal generation means in accordance with the output of said phase comparison means; and arithmetic processing means for synthesizing said plurality of sine-wave signals whose amplitudes are corrected by said amplitude correction means, and adding said synthesized plurality of sine-wave signals to the output of said phase comparison means.

8. The disc device according to claim 7, wherein said amplitude correction means comprises:

multiplication means for multiplying each of said plurality of sine-wave signals obtained from said sine-wave-signal generation means by the output of said phase comparison means; and storage means for successively storing each multiplication result from said multiplication means.

9. The disc device according to claim 8, wherein the number of said storage means corresponds to the number of said discoid recording media that may be processed by said phase synchronizing apparatus.

\* \* \* \* \*